US009174296B2

(12) United States Patent
Benjamin et al.

(10) Patent No.: US 9,174,296 B2
(45) Date of Patent: Nov. 3, 2015

(54) PLASMA IGNITION AND SUSTAINING METHODS AND APPARATUSES

(75) Inventors: Neil Martin Paul Benjamin, Palo Alto, CA (US); Andreas Fischer, Castro Valley, CA (US)

(73) Assignee: Lam Research Corporation, Fremont, CA (US)

( * ) Notice: Subject to any disclaimer, the term of this patent is extended or adjusted under 35 U.S.C. 154(b) by 647 days.

(21) Appl. No.: 12/908,459

(22) Filed: Oct. 20, 2010

(65) Prior Publication Data
US 2012/0097646 A1  Apr. 26, 2012

(51) Int. Cl.
B23K 9/00 (2006.01)
B23K 10/00 (2006.01)
B23K 9/013 (2006.01)

(52) U.S. Cl.
CPC ............. *B23K 10/00* (2013.01); *B23K 9/013* (2013.01); *B23K 2201/40* (2013.01)

(58) Field of Classification Search
CPC .................................. B23K 9/00; B23K 10/00
USPC ............... 219/121.5, 121.52, 121.59, 121.48, 219/121.47
See application file for complete search history.

(56) References Cited

U.S. PATENT DOCUMENTS

| 5,234,529 A | 8/1993 | Johnson |
| 5,614,055 A * | 3/1997 | Fairbairn et al. ......... 156/345.33 |
| 5,811,022 A * | 9/1998 | Savas et al. ..................... 216/68 |
| 5,903,106 A * | 5/1999 | Young et al. ............. 315/111.41 |
| 5,980,688 A * | 11/1999 | Blalock .................... 156/345.48 |
| 6,117,772 A * | 9/2000 | Murzin et al. ................ 438/681 |
| 6,132,566 A * | 10/2000 | Hofmann et al. ......... 204/192.17 |
| 6,264,742 B1 * | 7/2001 | Vekris et al. .................. 117/204 |
| 6,264,812 B1 * | 7/2001 | Raaijmakers et al. ... 204/298.06 |
| 6,304,036 B1 * | 10/2001 | Freeman et al. ......... 315/111.51 |
| 6,579,426 B1 * | 6/2003 | van Gogh et al. ........ 204/192.25 |
| 6,712,927 B1 * | 3/2004 | Grimbergen et al. ..... 156/345.24 |
| 6,915,964 B2 * | 7/2005 | Tapphorn et al. ............. 239/128 |
| 7,513,971 B2 * | 4/2009 | Brown et al. ............. 156/345.48 |
| 8,398,832 B2 * | 3/2013 | Nulman et al. .......... 204/298.06 |
| 2001/0008229 A1 | 7/2001 | Selitser |
| 2002/0185226 A1 * | 12/2002 | Lea et al. ................. 156/345.35 |
| 2005/0103623 A1 | 5/2005 | Tolmachev et al. |

* cited by examiner

Primary Examiner — David Angwin
Assistant Examiner — Ayub Maye
(74) Attorney, Agent, or Firm — Martine Penilla Group, LLP

(57) ABSTRACT

An apparatus for generating plasma including a plasma generating vessel and a coil having a coil length and a first set of partially enclosing, longitudinally oriented conductive (PELOC) fingers and a second set of PELOC fingers. The PELOC finger sets are oriented along a longitudinal axis of the vessel with each partially enclosing a periphery of the vessel. The two sets of PELOC fingers are oriented fingertips facing fingertips and separated by an inter-set distance that is less than the coil length.

20 Claims, 2 Drawing Sheets

PLASMA IGNITION AND SUSTAINING METHODS AND APPARATUSES

BACKGROUND OF THE INVENTION

In the manufacture of semiconductor products, substrates such as wafers undergo deposition and etching processes to form features thereon. The processing of semiconductor substrates often leaves residues, such as polymer deposition, between processing steps. Atmospheric inductively coupled plasma torches have been employed to clean substrates in preparation for further processing.

To facilitate discussion, FIG. 1 shows a typical prior art atmospheric inductively coupled plasma torch 100, which includes a double-wall cylinder 102. Cylinder 102 is typically formed out of quarts or a similarly suitable material. A cooling gas inlet 104 permits a cooling gas, such as nitrogen or air for example, to be injected in between the cylinder walls to thermally regulate double-wall cylinder 102 during use. By employing an appropriate cooling gas, thermal damage to atmospheric inductively coupled plasma torch 100 due to the high heat dissipation from the plasma therein is prevented.

A coil 106 is shown wrapped around the outer periphery of double-wall cylinder 102. During use, a process gas (e.g., hydrogen or nitrogen) is introduced into the interior volume of cylinder 102 through process gas inlet 108. When an appropriate driver RF signal (e.g., at 40 MHz) is supplied to coil 106, coil 106 acts as part of a series LC resonance circuit to ignite a plasma from the process gas. To help cool coil 106 during use, the coil is designed as a tube allowing liquid cooling to flow through it.

The inductively coupled plasma formed within atmospheric inductively coupled plasma torch 100 is ejected from opening 120. The hot jet of plasma ejected from opening 120 may then be employed to remove or clean materials, such as unwanted polymer deposition after an ion implantation process, from substrates.

As is known, the induced voltage across coil 106 is a function of the frequency of the driver RF signal. At 40 MHz, a typical atmospheric inductively coupled plasma torch may experience up to 20 KV (peak-to-peak) between the ends of coil 106, for example. The high induced voltage is necessary for igniting plasma at typical atmospheric conditions.

However, the high RF driver frequency employed in the prior art (e.g., 40 MHz or higher) presents cost and engineering challenges. For example, many processing systems already employ lower-frequency RF sources (e.g., 10-30 MHz, such as 13.56 MHz or 27.12 MHz) for etching and deposition. Accordingly, components and expertise for designing, manufacturing, qualifying, and maintaining lower-frequency subsystems are readily available at lower cost. Further, tool-to-tool repeatability is improved when a lower driver RF frequency is employed.

The invention relates to methods and apparatus for improving plasma ignition in an atmospheric inductively coupled plasma torch in particular and in inductively coupled plasma tools in general.

BRIEF DESCRIPTION OF THE DRAWINGS

The present invention is illustrated by way of example, and not by way of limitation, in the figures of the accompanying drawings and in which like reference numerals refer to similar elements and in which.

To facilitate discussion.

DETAILED DESCRIPTION OF THE PREFERRED EMBODIMENTS

The present invention will now be described in detail with reference to a few embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Generally speaking plasma ignition is dependent on the strength of the electric field that is applied across a given gas column. In the more specific case of a solenoid coil, ignition is dependent on the strength of the electric field inside the solenoid.

The electric field is generally governed by equation 1 below.

$$E = V/L \qquad \text{Eq. 1}$$

whereby V is the induced voltage between the coil ends, E is the strength of the electric field, and L is the length of the coil. It should be noted that by 'L, length of the coil' we mean the length of the coil solenoid and not the length of the wire that is used to wind the coil.

The inventors herein realize that if the effective length of the coil L can be reduced, a stronger electric field E can be obtained for the same induced voltage on the coil. Alternatively or additionally, if the induced voltage V is reduced (due to, for example, a reduction in the driver RF frequency), an electric field that is capable of satisfactorily igniting the plasma may still be created by lowering the effective length of the coil.

In one or more embodiments, there are provided partially enclosing, longitudinally oriented conductive (PELOC) fingers that effectively reduce the effective length of the coil. The PELOC fingers, as the name implies, are conductive strips or prongs or teeth or protrusions (referred to herein generically as "fingers") of conductive materials that are disposed outside of the quartz cylinder and are oriented along the longitudinal axis of the quartz cylinder of the atmospheric inductively coupled plasma torch. Two sets of a plurality of circumferentially spaced apart fingers are provided, with each set of fingers connected to a different coil end. The fingers of each set protrude from a "spine" (see definition below) or base and are configured to surround the cylinder and are disposed longitudinally with respect to the cylinder as well with the fingers of the first set pointing toward the second set (and vice versa) in a spatially separated manner. Embodiments of the invention also relate to techniques for manufacturing, provisioning, operating and maintaining these enhancements for an atmospheric inductively coupled plasma torch.

Figure 1:
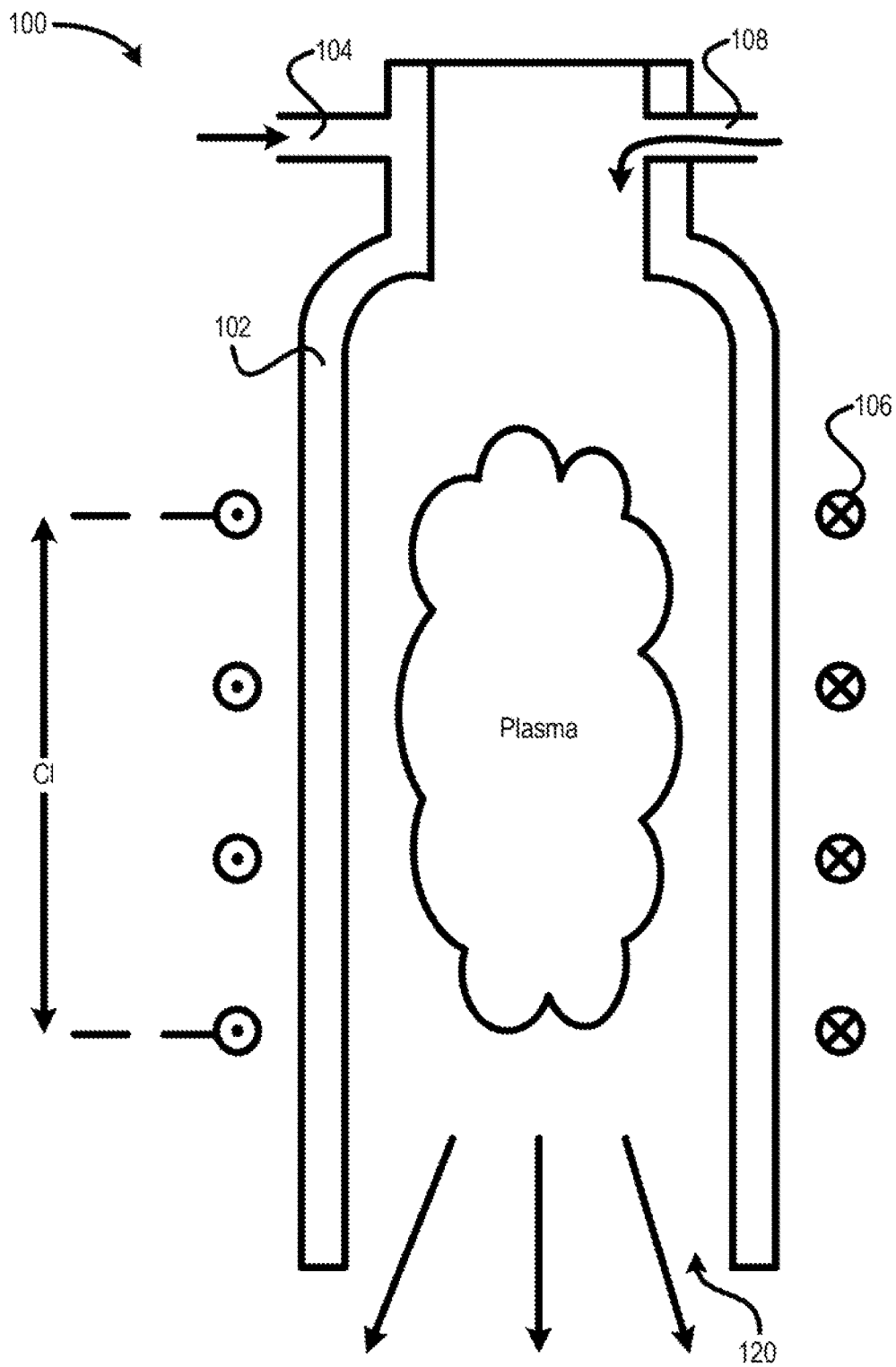
FIG. 1 shows a typical prior art atmospheric inductively coupled plasma torch.
Figure 2:
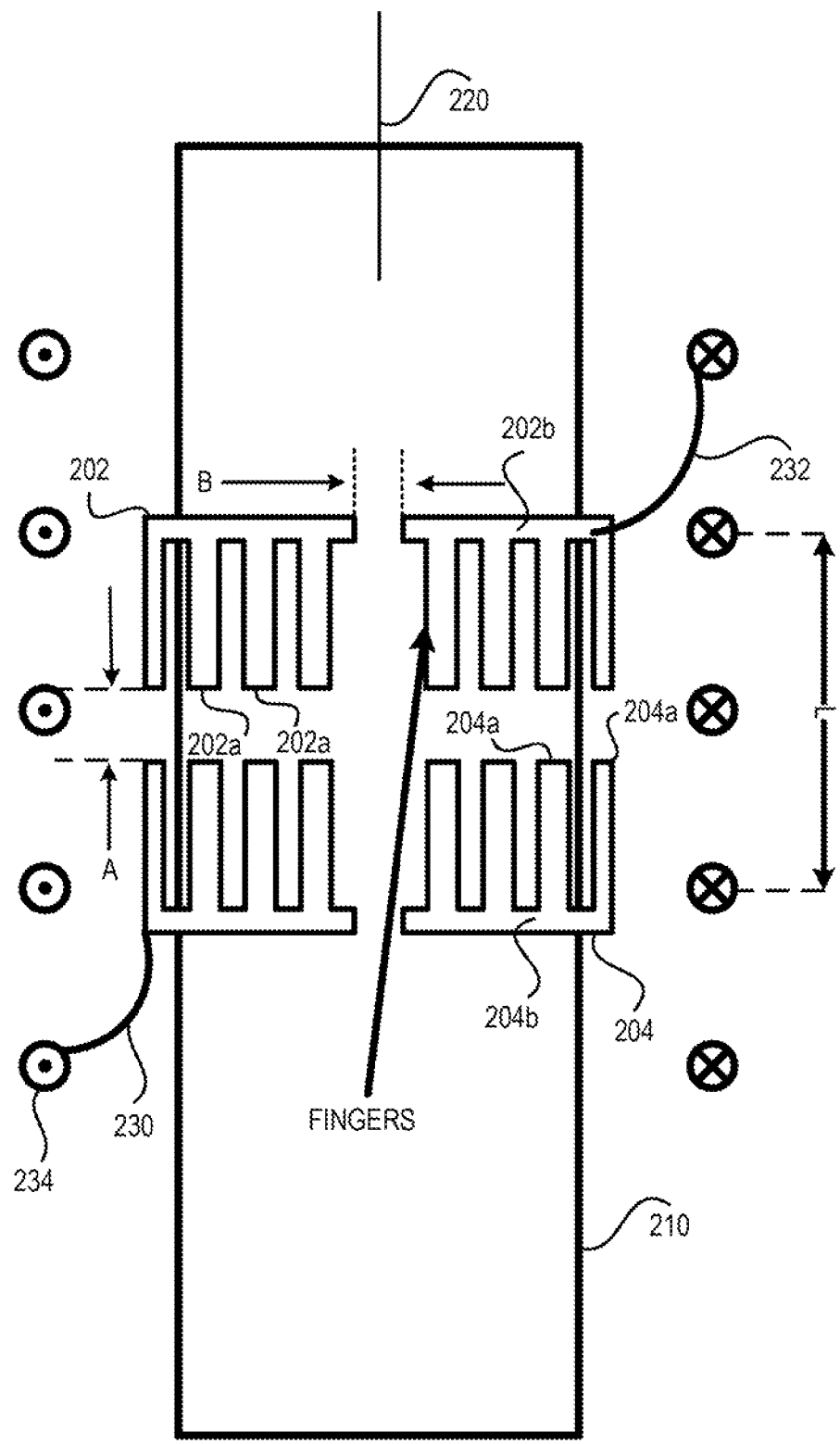
FIG. 2 shows, in accordance with an embodiment of the invention, an implementation of the present invention.

FIG. 2 shows, in accordance with an embodiment of the invention, an example configuration in which the conductive fingers 202a of PELOC finger set 202 are disposed longitudinally with respect to longitudinal axis 220 of cylinder 210. Likewise, the conductive fingers 204a of PELOC finger set 204 are disposed longitudinally with respect to the longitudinal axis 220 of cylinder 210. The PELOC finger set 202 and PELOC finger set 204 are arranged such that fingertips of the fingers 202a of PELOC finger set 202 point in the direction toward fingertips of the fingers 204a of PELOC finger set 204. As can be shown, the conductive fingers 202a of PELOC finger set 202 and the conductive fingers 204a of PELOC finger set 204 are spatially separated by a set-to-set gap A along the longitudinal axis 220 of cylinder 210.

The conductive fingers 202a are on a base or spine 202b of PELOC finger set 202 and the spine 202b only partially encloses the periphery of cylinder 210, resulting in an intra-set gap B as shown. Likewise, the conductive fingers 204a are on a base or spine 204b of PELOC finger set 204 only partially enclose the periphery of cylinder 210 resulting in an intra-set gap C as shown. These features and gaps are discussed in greater details hereinbelow.

By using longitudinally-oriented conductive fingers in the manners described herein magnetic field lines emanating from the coil are allowed to advance further inward and penetrate thru the quartz tube 210 to induce a circulating current sustaining plasma inside of the torch. This is possible as the fingers mentioned above are oriented essentially parallel to the direction of the magnetic field lines. The intra-set gap B substantially reduces the occurrence of circulating currents in the base or spine 202b of the PELOC fingers which would needlessly consume power as it would generate current heating inside the PELOC fingers. If the longitudinally-oriented conductive fingers of each finger set had been replaced by a same-size solid conductive band, undesirable circulating currents would have formed in the solid conductive bands. Further, the use of longitudinally-oriented conductive fingers in the manners described, herein-reduces the physical distance over which the coil voltage drops from L, the length of the coil to A, the inter-set gap. This reduction in length increases the electric field strength approximately by the ratio L/A for a given induced voltage. Because of this, plasma ignition may be enabled with a lesser induced voltage across the coil.

As mentioned, each set of PELOC fingers is coupled to a different coil end (via leads 230 and 232 in FIG. 2 for example) and the greater proximity A of the finger tips to each other as compared to L, the coil length is there to reduce the physical distance over which the coil voltage drops (a five-turn coil of length L is shown in FIG. 2 as an example). Again, this is the case since the sets of PELOC fingers are disposed closer together in a partially enclosing manner outside the cylinder. Set-to-set gap A (the terms "set-to-set" or "inter-set" denotes the finger-tip-to-finger-tip gap from one set of fingers to another set of fingers along the longitudinal axis of the cylinder) is preferably as small as possible to minimize this effective coil length. However, generally speaking, set-to-set gap A should not be so small as to cause arcing to occur between fingers 202a of PELOC finger set 202 and fingers 204a of PELOC finger set 204. Further, set-to-set gap A should also not be so small as to cause undesired plasma formation outside of the cylinder to occur between fingers of PELOC finger set 202 and fingers of PELOC finger set 204.

In an embodiment, an empirical method is employed to determine the size of set-to-set gap A for a particular torch. Initially, the two PELOC finger sets are partially wrapped around the cylinder and lined up along the longitudinal axis of the cylinder. At this point, the finger sets are positioned such that they are far apart from one another while still satisfying form factor constraints imposed by the size of the cylinder and while still being capable of igniting plasma inside the cylinder (although the large effective length of the coil at this gap distance would require a rather high coil voltage to generate the requisite E field to ignite the plasma). This places an upper limit on the size of set-to-set gap A.

The sets of PELOC fingers are then progressively moved along the longitudinal axis of the chamber toward one another. At some point, set-to-set gap A becomes so small that arcing occurs or the probability of arcing becomes unacceptably high. Further, as set-to-set gap A is made smaller, there is a risk that plasma ignition of ambient air may occur if the electric field set up in set-to-set gap A is high enough. Such uncontrolled plasma ignition of ambient air outside the cylinder is undesirable. The smallest set-to-set gap A that does not allow arcing or undesired ambient air ignition to occur establishes a lower bound on the size of set-to-set gap A.

The window in between the established upper bound and lower bound of set-to-set gap A is a suitable operating window. In a preferred embodiment, set-to-set gap A is set to be as small as possible as long as arcing or unwanted outside-the-cylinder plasma ignition is prevented. This minimum gap distance for set-to-set gap A ensures that the effective length of the coil is kept to a minimum while ensuring that arcing or unwanted plasma ignition will not occur.

Preferably, all the fingers of any one set of PELOC fingers are electrically coupled to one another. For each set of PELOC fingers, the individual fingers, while being electrically interconnected, are aligned longitudinally along the longitudinal axis of the cylinder as discussed earlier. An intra-set gap B (see FIG. 2) is provided such that the fingers of each PELOC set of fingers only partially enclose the outer circumference or outer periphery (if the cylinder is not round, for example) of the cylinder. This gap, referred to herein as an "intra-set" gap, specifies the dimension of the break made among the electrically connected fingers of a PELOC finger set in order to implement the "partially enclosing" feature.

The presence of intra-set gap B ensures that recirculating currents are minimized among fingers of each set of PELOC fingers. The dimension of intra-set gap B is designed with analogous considerations (e.g., arcing avoidance) as the design for set-to-set gap A. In one or more embodiments, intra-set gap B is preferably as small as possible to minimize non-uniformity in the generated electric field and induced magnetic field. Such non-uniformity may possibly affect the uniformity of the generated plasma and is minimized to the extent possible, in one or more embodiments of the invention.

In an embodiment, a strip of conductive material or conductive "spine" is provided to electrically and structurally connect the fingers of each set of PELOC fingers together. Each of the two "spines" is then connected to one of the coil ends (labeled 230 and 232 in FIG. 2). In this configuration, the fingers resemble teeth of a comb. One may visualize the two sets of PELOC fingers in this configuration, when disposed around the cylinder of an atmospheric inductively coupled plasma torch, as two combs with their teeth facing one another and separated teeth-tips-to-teeth-tips by a set-to-set gap. Each "comb" partially wraps around the cylinder of the atmospheric inductively coupled plasma torch such that there exists an intra-set gap where the two comb ends of the comb do not meet due to the partially enclosing feature but are rather separated by gap B. The comb implementation may be seen in FIG. 2, for example.

Generally speaking, the fingers may be made as slender or long/short as desired since the gaps between adjacent fingers allow the induced magnetic field to penetrate into the cylinder to reach the plasma therein. The conductive finger material may be copper, copper alloy, or a similarly suitable material. The coils for generating the electro-magnetic field may be disposed outside of the fingers (i.e., at a greater radius distance from the center longitudinal axis of the cylinder). A sufficient number of fingers should be provided in each 'comb' and spaced equal distance around the circumference of the quartz cylinder to avoid azimuthal non-uniformities in the applied electro-magnetic field.—The conductive fingers need to be wide enough to be mechanically stable but, generally speaking, should be kept narrower than the width of the gap between them to allow as many magnetic field lines from the coil as possible to advance to the inside of the quartz cylinder (a metal finger itself will be opaque to a time-varying magnetic field—only a gap allows the field to advance further inward. The magnetic field lines emanating from the coil are responsible for sustaining plasma inside the quartz tube). Generally speaking, the PELOC fingers are believed to contribute primarily to plasma ignition. Sustaining the plasma is believed to be driven primarily by the coil. Consequently, plasma uniformity tends to depend on how uniform the winding pitch of the coil is and how well the coil is coaxially aligned with the quartz cylinder.

In one or more embodiments, if a very low RF driver frequency is desired or if a very low induced coil voltage is desired, the techniques and apparatuses disclosed herein may be combined with the novel coil winding techniques and apparatuses of a commonly-owned co-pending patent application entitled "METHODS AND APPARATUS FOR IGNITING AND SUSTAINING PLASMA", filed on even date herewith by the same inventors herein and incorporated by reference for all purposes.

By combining the present techniques/apparatuses that shorten the effective length of the coil with techniques/apparatuses that increase the coil's inductance via an increase in the number of coil turns, it is possible to generate an electric field that is capable of igniting a plasma inside the cylinder with a very low RF driver frequency and/or with a very low induced coil voltage. It is envisioned that induced coil voltages in the range of some thousands of volts may be adequate to ignite the plasma inside the cylinder, in some embodiments. These two techniques advantageously manipulate different mechanisms for electric field generation in an atmospheric inductively coupled plasma torch and do not interfere with one another. The combined techniques and apparatuses represent unique innovations, in one or more embodiments.

As can be appreciated from the foregoing, embodiments of the invention enhance the utilization of the plasma-igniting electro-magnetic field in an atmospheric inductively coupled plasma torch. With the techniques and apparatuses disclosed herein, plasma ignition in an atmospheric inductively coupled plasma torch is possible even if the induced coil voltage is lowered, e.g., due to the lowering of the driver RF frequency for example. When the required induced coil voltage and/or driver RF frequency is reduced, RF generators as well as components for the atmospheric inductively coupled plasma torch may be made more inexpensively and may be matched system-to-system with greater ease, contributing to lower production cost for semiconductor products.

It should be kept in mind also that while these techniques/apparatuses are discussed in connection with atmospheric inductively coupled plasma torches, it is contemplated that the same techniques and apparatuses may be employed to improve plasma ignition and sustaining in other inductively coupled plasma tools and chambers. Having disclosed exemplary embodiments and the best mode, modifications and variations may be made to the disclosed embodiments while remaining within the subject and spirit of the invention as defined by the following claims.

The invention claimed is:

1. An apparatus for generating plasma, comprising: a vessel within which said plasma is generated; and a coil configured to receive an RF driver signal to at least sustain said plasma, said coil having a coil length; a first spine and a plurality of fingers extending from said first spine and circumferentially spaced apart from each other, each of said plurality of fingers are oriented along a longitudinal axis of said vessel and said plurality of fingers of said first spine and said first spine partially enclose a periphery of said vessel, said plurality of fingers of said first spine being electrically coupled to a first end of said coil; and a second spine and a plurality of fingers extending from said second spine and circumferentially spaced apart from each other, each of said plurality of fingers are oriented along said longitudinal axis of said vessel and said plurality of fingers of said second spine and said second spine partially enclose said periphery of said vessel, said plurality of fingers of said second spine being electrically coupled to a second end of said coil, wherein tips of said plurality of fingers of said first spine and second spine are oriented directionally in a direction to face each other and are axially separated along the longitudinal axis by a distance that is less than said coil length; wherein the first spine, the second spine and the coil are located exterior to said vessel.

2. The apparatus of claim 1 wherein said coil is disposed at a greater radius from a said longitudinal axis of said vessel than said first and second spines and respective plurality of fingers.

3. The apparatus of claim 1 wherein one of said first end of said coil and said second end of said coil is coupled to ground.

4. The apparatus of claim 1 wherein the plurality of fingers of said first and second spines are disposed parallel to magnetic field lines generated when said coil is energized with said RF driver signal.

5. The apparatus of claim 1 wherein said vessel represents a plasma-generating vessel of an atmospheric inductively coupled plasma torch.

6. The apparatus of claim 1 wherein said coil is implemented by one of a tube-in-a-tube configuration and a side-by-side tubing configuration.

7. The apparatus of claim 1 wherein a first end of said coil is coupled to ground, said first end also represents an end for injecting and extracting cooling fluid.

8. The apparatus of claim 1 wherein the vessel has a cylindrical vertical wall portion and the plurality of fingers of the first and second spines are aligned exterior and adjacent the cylindrical vertical wall portion.

9. An apparatus for generating plasma, comprising: a vessel within which said plasma is generated; and a coil configured to receive an RF driver signal to sustain said plasma during operation, said coil having a coil length that has circumferential turns that circle around and outside the vessel; a first spine having a plurality of fingers extending from said first spine, each of the plurality of fingers of said first spine being circumferentially spaced apart from each other, and each of said plurality of fingers of said first spine is oriented along a longitudinal axis of said vessel, wherein said plurality of fingers of said first spine and said first spine encircle a periphery of said vessel except for a first gap, said plurality of fingers of said first spine being electrically conductive and coupled to a first end of said coil; and a second spine having a plurality of fingers extending from said second spine, each of the plurality of fingers of said second spine being circumferentially spaced apart from each other, and each of said plurality of fingers of said second spine is oriented along the longitudinal axis of said vessel, wherein said plurality of fingers of said second spine and said second spine encircle the periphery of said vessel except for a second gap, said plurality of fingers of said second spine being electrically conductive and coupled to a second end of said coil; wherein the first spine and plurality of fingers and the second spine and plurality of fingers are spaced apart by a third gap, the third gap defined by a length between tip ends of the plurality of fingers of the first spine and the second spine that are oriented directionally to face each other along the longitudinal axis, the length being less than said coil length; wherein the plurality of fingers of the first spine and the second spine are exterior to said vessel and disposed between the vessel and the coil.

10. The apparatus of claim 9 wherein one of said first end of said coil and said second end of said coil is coupled to ground.

11. The apparatus of claim 9 wherein said vessel represents a plasma-generating vessel of an atmospheric inductively coupled plasma torch.

12. The apparatus of claim 9 wherein said coil is implemented by one of a tube-in-a-tube configuration and a side-by-side tubing configuration.

13. The apparatus of claim 9 wherein a first end of said coil is coupled to ground, said first end also represents an end for injecting and extracting cooling fluid.

14. The apparatus of claim 9 wherein the vessel has a cylindrical vertical wall portion and the plurality of fingers of the first and second spines are aligned exterior and adjacent the cylindrical vertical wall portion.

15. The apparatus of claim 9 wherein the plurality of fingers of the first and second spines are disposed between the vessel and the coil.

16. An apparatus for generating a plasma, comprising: a vessel for containing said plasma during operation; an radio frequency (RF) source; a coil coupled to said radio frequency (RF) source, said coil having a coil length that has circumferential turns that circle around and outside the vessel; a first spine having a plurality of fingers extending from said first spine, each of the plurality of fingers of said first spine being circumferentially spaced apart from each other, and each of said plurality of fingers of said first spine is oriented along a longitudinal axis of said vessel, wherein said plurality of fingers of said first spine and said first spine encircle a periphery of said vessel except for a first gap, said plurality of fingers of said first spine being electrically conductive and coupled to a first end of said coil; and a second spine having a plurality of fingers extending from said second spine, each of the plurality of fingers of said second spine being circumferentially spaced apart from each other, and each of said plurality of fingers of said second spine is oriented along the longitudinal axis of said vessel, wherein said plurality of fingers of said second spine and said second spine encircle the periphery of said vessel except for a second gap, said plurality of fingers of said second spine being electrically conductive and coupled to a second end of said coil; wherein the first spine and plurality of fingers and the second spine and plurality of fingers are spaced apart by a third gap, the third gap defined by a length between tips of the plurality of fingers of the first spine and the second spine, the first spine and the second spine being oriented at opposite sides of the tips of the plurality of fingers along the longitudinal axis; wherein the tips of the plurality of fingers of the first spine and the second spine are oriented to directionally face each other, the length being less than said coil length; wherein the plurality of fingers of the first spine and the second spine are disposed exterior said vessel and between the vessel and the coil.

17. The apparatus of claim 16, wherein the first and second gaps of each of the first and second spines are configured to reduce recirculating currents among said plurality of fingers.

18. The apparatus of claim 16 wherein said vessel represents a plasma-generating vessel of an atmospheric inductively coupled plasma torch, and wherein said coil is implemented by one of a tube-in-a-tube configuration and a side-by-side tubing configuration.

19. The apparatus of claim 16 wherein a first end of said coil is coupled to ground, said first end also represents an end for injecting and extracting cooling fluid.

20. The apparatus of claim 16 wherein the vessel has a cylindrical vertical wall portion and the plurality of fingers of the first and second spines are aligned exterior and adjacent the cylindrical vertical wall portion.

\* \* \* \* \*